US012656036B2

(12) United States Patent　　　(10) Patent No.:　US 12,656,036 B2

Chen et al.　　　(45) Date of Patent:　Jun. 16, 2026

(54) HIGH PERFORMANCE COOLING MODULE

(71) Applicant: QUANTA COMPUTER INC.,
Taoyuan City (TW)

(72) Inventors: Chao-Jung Chen, Taoyuan City (TW);
Yu-Nien Huang, Taoyuan City (TW);
Herman Tan, Taoyuan City (TW);
Tien-Juei Chuang, Taoyuan City (TW)

(73) Assignee: Quanta Computer Inc., Taoyuan City
(TW)

( * ) Notice: Subject to any disclaimer, the term of this
patent is extended or adjusted under 35
U.S.C. 154(b) by 315 days.

(21) Appl. No.: 17/902,029

(22) Filed: Sep. 2, 2022

(65) Prior Publication Data

US 2024/0008218 A1　　Jan. 4, 2024

Related U.S. Application Data

(60) Provisional application No. 63/357,288, filed on Jun.
30, 2022.

(51) Int. Cl.
　　F25B 49/02　　　(2006.01)
　　F25B 25/00　　　(2006.01)
　　H05K 7/20　　　(2006.01)
(52) U.S. Cl.
　　CPC ............ F25B 49/02 (2013.01); F25B 25/005
　　　　(2013.01); H05K 7/20136 (2013.01);
　　　　(Continued)
(58) Field of Classification Search
　　CPC .. F25B 49/02; F25B 2700/21; F25B 2700/19;
　　　　　F25B 2600/2513; F25B 2600/13;
　　　　(Continued)

(56) References Cited

U.S. PATENT DOCUMENTS 5,323,847 A　*　6/1994　Koizumi ............ H05K 7/20645
　　　　　　　　　　　　　　　　　165/200
2008/0232064 A1 *　9/2008　Sato ................... H05K 7/20754
　　　　　　　　　　　　　　　　　361/679.49
(Continued)

FOREIGN PATENT DOCUMENTS

CN　　　101135475 A　　3/2008
CN　　　101420839 A　　4/2009
(Continued)

OTHER PUBLICATIONS

Translated_Thielmann (Year: 1995).*
(Continued)

*Primary Examiner* — Jerry-Daryl Fletcher
*Assistant Examiner* — Samba Gaye
(74) *Attorney, Agent, or Firm* — NIXON PEABODY LLP

(57)　　　　　ABSTRACT

A hybrid cooling system is disclosed that combines a liquid
coolant cycle and a refrigerant cycle to efficiently and
effectively transfer heat away from a heat-generating com-
ponent of a computing device. The liquid coolant cycle
pumps a liquid coolant through a cold plate to extract heat
from the heat-generating component. The heated liquid
coolant passes through a coolant-to-refrigerant heat
exchanger, where refrigerant from the refrigerant cycle
absorbs the heat from the liquid coolant. The heated refrig-
erant passes through a compressor to a condenser, where the
high-pressure, heated refrigerant is cooled by air passing
over the condenser. The hybrid cooling system enables
cooling of a heat-generating component better than by
non-hybrid cooling systems.

16 Claims, 5 Drawing Sheets

400 ⟍

☒ Cool Liquid Coolant　　▨ High-Pressure, Superheated Vapor Refrigerant
▨ Hot Liquid Coolant　　▨ High-Pressure, Warm Liquid Refrigerant
□ Low-Pressure, Cold Liquid-vapor Refrigerant
▨ Low-Pressure, Heated Vapor Refrigerant

(52) U.S. Cl.
  CPC ..... *H05K 7/20318* (2013.01); *H05K 7/20354*
    (2013.01); *H05K 7/20381* (2013.01); *F25B*
    *2600/02* (2013.01); *F25B 2600/13* (2013.01);
    *F25B 2600/2513* (2013.01); *F25B 2700/19*
    (2013.01); *F25B 2700/21* (2013.01)

(58) Field of Classification Search
  CPC .............. F25B 2600/02; F25B 25/005; H05K
    7/20381; H05K 7/20354; H05K 7/20318;
    H05K 7/20136
  See application file for complete search history.

(56) References Cited

U.S. PATENT DOCUMENTS

| | | | | | |
|---|---|---|---|---|---|
| 2014/0355202 | A1* | 12/2014 | Lecourtier | ......... | H05K 7/20818 |
| | | | | | 165/104.33 |
| 2015/0109730 | A1* | 4/2015 | Campbell | .......... | F28D 15/0266 |
| | | | | | 165/104.27 |
| 2017/0181326 | A1* | 6/2017 | Shelnutt | ............. | H05K 7/20781 |
| 2018/0270989 | A1* | 9/2018 | Chainer | .................. | G06F 1/206 |
| 2018/0299933 | A1* | 10/2018 | Cui | .................... | H05K 7/20772 |
| 2019/0030984 | A1* | 1/2019 | Zeigler | ................. | F25B 25/005 |
| 2022/0087076 | A1* | 3/2022 | Malouin | ........... | H05K 7/20736 |

FOREIGN PATENT DOCUMENTS

| | | | | |
|---|---|---|---|---|
| CN | 112822909 | A | 5/2021 | |
| CN | 214901821 | U | 11/2021 | |
| DE | 4413130 | A1 * | 10/1995 | .............. H02B 1/56 |
| JP | H08-063261 | B2 | 3/1996 | |
| JP | 2009081439 | A | 4/2009 | |
| JP | 2012088831 | A | 5/2012 | |
| JP | 2014234992 | A | 12/2014 | |
| JP | 2016015167 | A | 1/2016 | |
| TW | M338390 | U | 8/2008 | |
| TW | M616775 | U | 9/2021 | |

OTHER PUBLICATIONS

JP Office Action for Application No. 2023-026884, mailed Apr. 16, 2024, w/ First Office Action Summary, 9 pp.
TW Office Action for Application No. 111143963, mailed Jul. 25, 2023, w/ First Office Action Summary.
TW Search Report for Application No. 111143963, mailed Jul. 25, 2023, w/ First Office Action.
CN Office Action for Application No. 202211539844.4 mailed Apr. 10, 2026, w/ Summary, 7 pp.
CN Search Report for Application No. 202211539844.4 mailed Apr. 10, 2026, w/ First Office Action, 2 pp.

* cited by examiner

Input Device(s)
504

Memory
518

Processor(s)
502

System Controller
522

512

Operating System
514

Application(s)
520

510

Display
506

Network Interface(s)
508

500

HIGH PERFORMANCE COOLING MODULE

CROSS-REFERENCE TO RELATED APPLICATIONS

This application claims priority under 35 U.S.C. § 119 to U.S. Provisional Application No. 63/357,288, entitled "High Performance Cooling Module," and filed on Jun. 30, 2022. The contents of that application are hereby incorporated by reference in their entirety.

TECHNICAL FIELD

The present disclosure relates to computing devices generally and more specifically to cooling heat-generating components of computing devices.

BACKGROUND

Computing devices, such as personal computers, servers, and the like, can often generate large amounts of heat. In particular, certain electronic components within computing devices may generate especially high amounts of heat, which must be efficiently for the component to operate optimally. For example, central processing units, graphical processing units, tensor processing units, and various other purpose-built processing devices can especially generate high amounts of heat. As the need for more powerful computing components continues to grow, these components may use more power, operate faster, and otherwise operate in a fashion that generates more heat.

Routine techniques for cooling components of computing devices include passive cooling (e.g., fan-less cooling for components that generate relatively low amounts of heat), fan-based cooling (e.g., using a fan to pass cooler air over a warmer computing component), and liquid cooling. Liquid cooling has higher density and larger specific heat characteristics compared to air, and thus can dissipate more heat with a considerably lower flow rate than air cooling. Liquid cooling involves pumping a liquid coolant (e.g., water) through a cold plate that is attached to the heat-generating component, then through a radiator, which is often positioned adjacent fans to pass cooler air past the warmer radiator. Heat from the heat-generating component thus passes into the liquid via the cold plate, after which the heated liquid passes through the radiator, permitting heat to be transferred to the air surrounding the radiator, after which the now-cooled liquid passes back through the cold plate to continue the loop.

In liquid cooling systems, however, the cooling capability is primarily dictated by the size of the radiator and how much air is flowing through the radiator to dissipate the heat. In real-world applications, available space for radiators is very limited, which places a significant constraint over the cooling capability of a liquid cooling device. Because of these and other constraints inherent with liquid cooling, liquid-cooled computing components may not be able to run at the high speeds or with the high power that they otherwise may be capable of running, and may need to be throttled back.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, supplemented by this summary. This summary is a high-level overview of various aspects of the disclosure and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings and each claim.

Embodiments of the present disclosure include a system comprising a computing device having a heat-generating component. The system further comprises a cold plate thermally coupled to the heat-generating component. The system further comprises a coolant pathway loop coupling an exit of the cold plate with an entrance of the cold plate. The coolant pathway loop contains a coolant fluid that enters the cold plate at a lower temperature than when exiting the cold plate. The system further comprises a refrigerant cycle. The refrigerant cycle includes a refrigerant pathway loop coupling a compressor, a condenser, and an expansion valve. The refrigerant pathway loop contains a refrigerant. The system further comprises a heat exchanger coupled to the coolant pathway loop and the refrigerant pathway loop such that heat in the coolant fluid is transferred to the refrigerant at a location after the expansion valve and before the compressor.

Embodiments of the present disclosure include a method comprising operating a computing device. Operating the computing device includes generating heat at a heat-generating component. The method further includes pumping coolant through a coolant pathway loop. Pumping coolant through the coolant pathway loop includes pumping coolant through a cold plate that is thermally coupled to the heat-generating component and through a heat exchanger. The method further includes compressing a refrigerant within a refrigerant pathway loop. Compressing the refrigerant causes the compressed refrigerant to pass through a condenser and an expansion valve before reaching the heat exchanger. The refrigerant passing through the heat exchanger extracts heat from the coolant passing through the heat exchanger.

BRIEF DESCRIPTION OF THE DRAWINGS

The specification makes reference to the following appended figures, in which use of like reference numerals in different figures is intended to illustrate like or analogous components.

DETAILED DESCRIPTION

Certain aspects and features of the present disclosure relate to a hybrid cooling system that combines a liquid coolant cycle and a refrigerant cycle to efficiently and effectively transfer heat away from a heat-generating component of a computing device. The liquid coolant cycle pumps a liquid coolant through a cold plate to extract heat from the heat-generating component. The heated liquid coolant passes through a coolant-to-refrigerant heat exchanger, where refrigerant from the refrigerant cycle absorbs the heat from the liquid coolant. The heated refrigerant passes through a compressor to a condenser, where the high-pressure, heated refrigerant is cooled by air passing over the condenser. The hybrid cooling system enables cooling of a heat-generating component better than by non-hybrid cooling systems.

Figure 1:
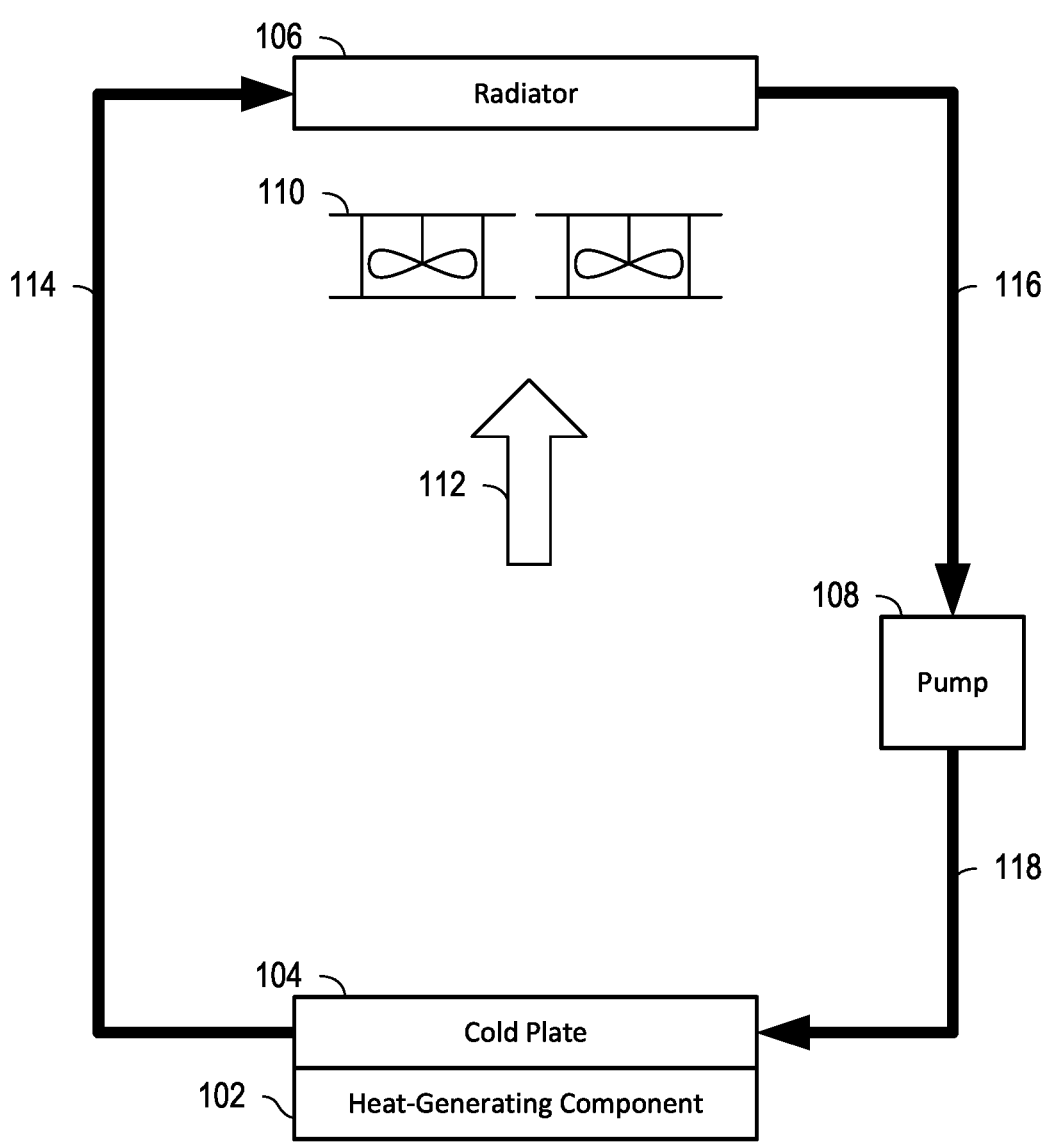
FIG. 1 is schematic diagram of a standard liquid cooling system.

FIG. 1 is schematic diagram of a standard liquid cooling system 100. The standard liquid cooling system 100 includes a cold plate 104 thermally coupled to a heat-generating component 102. Relatively cool liquid coolant is pumped, by pump 108, into the cold plate 104 through line 118. Within the cold plate, heat is transferred from the heat-generating component 102 to the liquid refrigerant, which is then passed out of the cold plate 104 along line 114. The now-heated liquid refrigerant passes through a radiator 106 before it passes back to the pump 108 via line 116. While passing through the radiator 106, heat from the liquid coolant is transferred to surrounding air. The use of fans 110 can force airflow 112 past the radiator 106 to improve heat transfer from the liquid coolant at the radiator 106.

While this standard liquid cooling system 100 may be effective for some use cases, its cooling capabilities are limited by various constraints, such as the size of the radiator 106 and how much air is flowing through the radiator 106 to dissipate the heat. For many computing devices, the available room in the chassis is limited, and thus the size and style of radiator 106 and fans 110 is likewise limited, which constrains the available cooling capable by the liquid cooling system 100.

Certain aspects of the present disclosure, however, are able to overcome these and other limitations through the use of hybrid cooling.

A hybrid cooling system improves upon liquid coolant cycles by eliminating the radiator. Rather, a coolant-to-refrigerant heat exchanger thermally couples the liquid coolant cycle with a refrigerant coolant cycle. The liquid coolant cycle initially absorbs heat from the heat-generating component, after which the heated liquid coolant transfers heat to the refrigerant cycle via the heat exchanger. Thus, there is no need for fans or other air movers within the liquid coolant cycle. The then-cooled liquid coolant can be pumped through the cold plate to continue absorbing heat from the heat-generating component.

Meanwhile, the heat absorbed by the refrigerant in the heat exchanger causes the refrigerant to change state from a liquid to a gas. This superheated vapor refrigerant is then compressed to attain higher temperatures and higher pressures via a compressor. After leaving the compressor, the superheat vapor is routed to condenser, where heat can be effectively removed from the superheated refrigerant vapor, allowing the refrigerant to condense back to compressed liquid refrigerant. The use of fans or other air movers can improve the effectiveness of the condenser. After exiting the condenser, the compressed liquid refrigerant can be vaporized into ultra-low temperature liquid vapor mixture refrigerant with low pressure via adiabatic expansion through an expansion valve. This ultra-low temperature liquid vapor mixture refrigerant is used to absorb the heat from coolant of the liquid coolant cycle via the heat exchanger unit, which will cause the refrigerant to become the superheated vapor refrigerant with low pressure that passes back into the compressor for the next cycle.

Of note, conventional liquid cooling systems are only able to cool liquid coolant down to, at most, ambient air temperature via its radiator. A hybrid cooling system can cool the liquid coolant down to temperatures lower than ambient air temperatures via the heat exchanger. Thus, the cold plate of a hybrid cooling system can achieve much lower temperatures than a cold plate of a conventional liquid cooling system.

As another benefit, refrigerant can be compressed to much higher temperatures than hot liquid coolant in a conventional liquid cooling system. Thus, the condenser in a hybrid cooling system is much more efficient at dissipating heat than a radiator in the conventional system due to the much larger temperature difference between the working fluid (e.g., refrigerant in a refrigerant cycle and liquid coolant in the liquid coolant cycle) and the surrounding air. As a result, similar or better cooling efficacy can be achieved in a hybrid cooling system by consuming less air flow and less fan power than in a liquid cooling system. As such, a hybrid cooling system can cool electronic components to lower temperatures with lower cooling power consumption. Different refrigerants, pressures, condenser designs, heat exchanger designs, and condenser airflow can be used to achieve a desired level of cooling. In some cases, the refrigerant can reach temperatures at least 10-15° F. colder than ambient air.

Further, the use of a liquid coolant cycle within the hybrid cooling system keeps the cold plate operating within operational limits of the heat-generating component. If a refrigerant cycle were to be coupled directly to a cold plate, the cold plate may reach temperatures that are far too low for efficient operation of the heat-generating component, and may lead to condensation issues around the cold plate.

Further, the components of the hybrid cooling system can be easily positioned at different locations within a computer chassis, permitting a more efficient layout of cooling system components. For example, while the cold plate needs to be placed in contact with the heat-generating component for efficient thermal coupling, the other components may be spaced apart from the heat-generating component and even spaced apart from other electrical components and circuit boards. For example, the pump and compressor may be placed in spaced apart from any vibrationally isolated from certain vibrationally sensitive components. Also, the heat exchanger can be positioned away from liquid-sensitive components to minimize risk of condensation problems if the insulation around the heat exchanger is compromised. Also, the condenser can be placed in a location that is able to receive substantial amounts of airflow, thus improving the efficiency of the cooling system.

In some cases, a hybrid cooling system can be placed into a multi-unit rackmount chassis, with certain components of the hybrid cooling system placed in a section or level of the chassis that is separate from the section with the heat-generating components. For example, in a 5 U chassis, the computing system's motherboard and all of its electrical components can reside in a bottom 2 U level, along with the cold plate of the hybrid cooling system, while the top 3 U level is used for most of the other components of the hybrid cooling system. Liquid coolant can be routed from cold plate at bottom level to the heat exchanger at top level with hose or piping. In the 3 U upper level, the condenser unit can be situated in perpendicular with airflow direction to achieve optimum heat exchanger from refrigerant to air ambient whilst the coolant to refrigerant heat exchanger can be placed in parallel with airflow direction to prevent blocking airflow. Each level can have its own fan(s) and can be operated independently to achieve efficient cooling power usage. A fan in the bottom 2 U can provide sufficient airflow to cool other components of the computing system, such as memory (DDR), storage (HDD) add-on cards, and the like. One or more fans on the 3 U upper level can provide airflow to the condenser for the refrigerant-to-ambient-air heat exchange. Other size chassis can be used, such as 1 U, 0.5 U, 2 U, and non-rackmount chassis.

In some cases, the hybrid cooling system can be provided as a retrofit kit, with all of the components of the refrigerant cycle ready to install, replacing the liquid coolant cycle's radiator with the coolant-to-refrigerant heat exchanger.

In some cases, a control system can monitor the temperature at one or more locations in the hybrid cooling system and/or in the heat-generating component, and/or the pressure at one or more locations in the refrigerant cycle, to control the hybrid cooling system. In some cases, the control system can control the pump of the liquid cooling system and/or the compressor and/or the expansion valve of the refrigerant cooling system. Such a control system can be a baseboard management controller, can be incorporated into the computing device's operating system, or can be an external controller (e.g., external to the computing device, and optionally external to the chassis).

In some cases, the use of a hybrid cooling system permits effective cooling to be accomplished even if the ambient air is relatively warm. For example, if the ambient air being used to cool the system is already warm, whether from naturally warm ambient air (e.g., for an edge computing device located outdoors) or from other nearby heat sources (e.g., for a computing device near high-temperature machinery and/or other high-temperature computing devices), a liquid coolant system may not be able to cool the cold plate at all, or may not provide much cooling ability because the temperature difference of the liquid coolant and the ambient air may be very small. However, a hybrid cooling system could be set up to operate with much higher refrigerant temperatures entering the condenser, thus still maintaining a substantial gap between the refrigerant's temperature and the warm, ambient air's temperature. By maintain such a temperature gap, the hybrid cooling system is still able to dissipate heat into the ambient air.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative embodiments but, like the illustrative embodiments, should not be used to limit the present disclosure. The elements included in the illustrations herein may not be drawn to scale.

Figure 2:
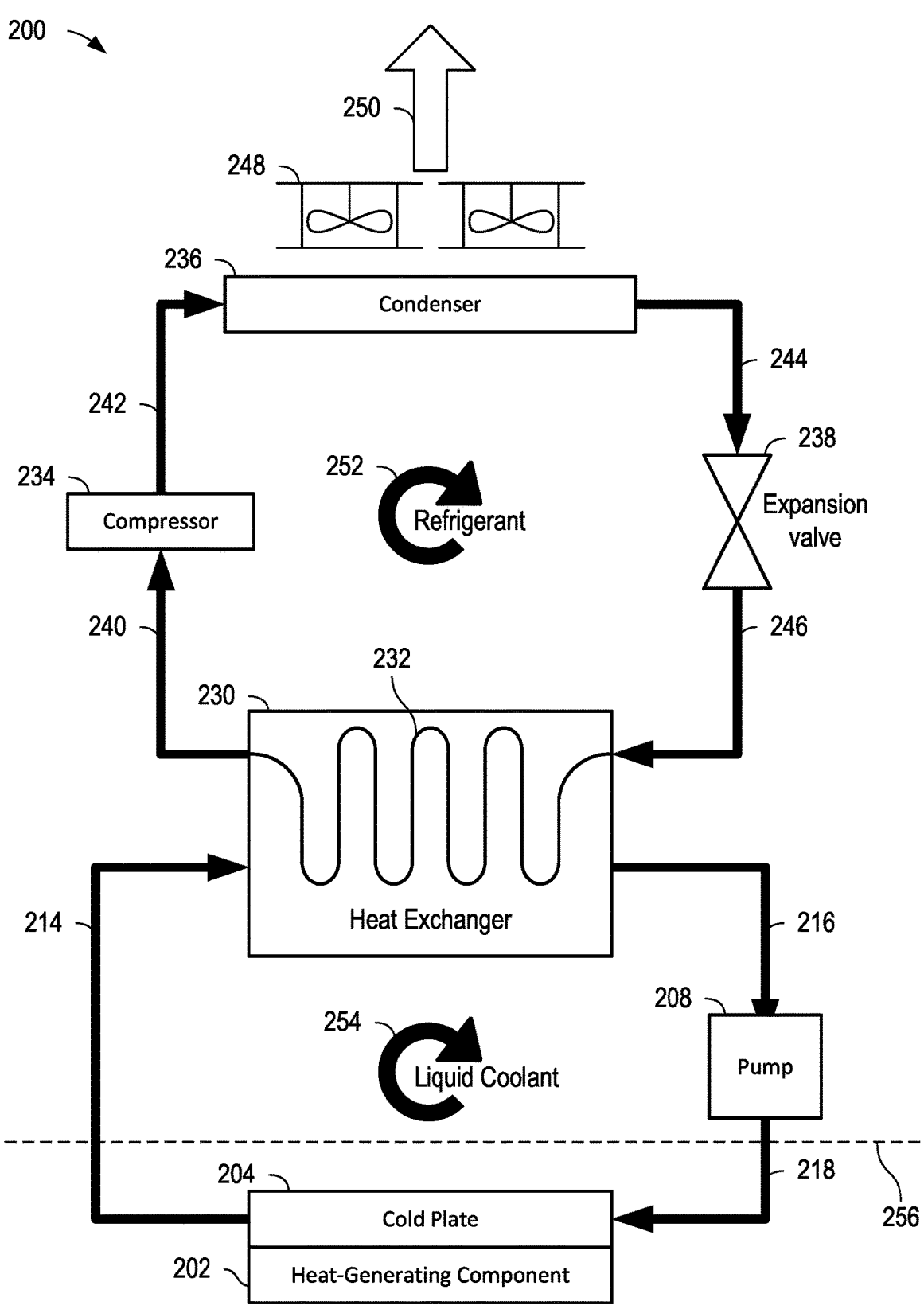
FIG. 2 is a schematic diagram of a hybrid cooling system, according to certain aspects of the present disclosure.

FIG. 2 is a schematic diagram of a hybrid cooling system 200, according to certain aspects of the present disclosure. The hybrid cooling system 200 includes a liquid coolant cycle 254 thermally coupled to a refrigerant cycle 252 via a heat exchanger 230. The heat exchanger 230 can be any suitable heat exchanger, such as tubular heat exchanger (e.g., a shell-and-tube heat exchanger), a plate heat exchanger, or the like.

The hybrid cooling system 200 can be used with any suitable electronic component, such as a heat-generating component 202 of a computing device. The heat-generating component 202 generates heat during use which must be transferred away from the heat-generating component 202 to avoid the need to throttle the heat-generating component 202 and/or to avoid damage to the heat-generating component 202 or surrounding components.

The liquid coolant cycle 254 includes a cold plate 204 thermally coupled to the heat-generating component 202 (e.g., via a thermally conductive material, such as thermal paste, or otherwise) such that heat from the heat-generating component 202 dissipates into the cold plate 204. A liquid coolant pathway loop couples an exit of the cold plate 204 with an entrance of the cold plate 204, allowing liquid coolant therein to absorb heat from the cold plate 204 and transfer the heat to another location before returning to the cold plate 204. The coolant fluid, also known as liquid coolant, within the liquid coolant pathway loop can be any suitable coolant fluid, such as water or polyethylene glycol. The liquid coolant pathway loop can include a heat exchanger 230 and a pump 208, as well as a number of connecting fluid pathways (e.g., tubes, pipes, channels, or the like). For illustrative purposes, fluid pathways carrying liquid coolant will be described as pipes and fluid pathways carrying refrigerant will be described as tubes, although any suitable fluid pathways can be used for either working fluid.

Liquid coolant exiting the cold plate 204 at an elevated temperature, due to absorbing heat from the cold plate 204, passes through a pipe 214 to the heat exchanger 230. In the heat exchanger 230, the liquid coolant dissipates heat into the refrigerant of the refrigerant cycle 252. The liquid coolant exits the heat exchanger 230 at a lower temperature than when entering the heat exchanger 230, and passes through pipe 216 to the pump 208. The pump 208 can pressurize the liquid coolant to keep it flowing through the liquid coolant pathway loop. The pressurized liquid coolant can exit the pump 208 at pipe 218, which carries the liquid coolant to the cold plate 204. Other arrangements can be used, such as with the pump 208 being inline after the cold plate and before the heat exchanger 230.

The refrigerant cycle 252 can include a refrigerant pathway loop that couples a compressor 234, a condenser 236, an expansion valve 238, and the heat exchanger 230, in that order, via one or more connecting refrigerant pathways (e.g., tubes, pipes, channels, or the like). The compressor 234 can take a low pressure vapor refrigerant and pressurize it into a high pressure vapor that exits via tube 242 to the condenser 236. As the refrigerant's pressure increases, its temperature also rises, increasing the gap between the refrigerant's temperature and the ambient air temperature. In the condenser 236, the high-pressure, high-temperature vapor refrigerant condenses, changing state from a vapor to a liquid, dissipating heat, via the condenser, into the ambient air. A set of one or more fans 248 can be used to generate airflow 250 through and/or past the condenser, which can improve the rate of refrigerant condensation. Refrigerant can leave the condenser 236 and travel via tube 244 to the expansion valve 238. Leaving the condenser 236, the refrigerant is cooler than it was when entering the condenser 236, although still under pressure provided by the compressor 234. Upon reaching the expansion valve 238, the cooler, high-pressure liquid refrigerant expands to a low-pressure, cooler liquid-vapor mixture. This cool, liquid-vapor mixture refrigerant passes through tube 246 into the heat exchanger 230, where it follows path 232 until it exits the heat exchanger 230 and travels via tube 240 back to the compressor 234. The path 232 can be a serpentine path, although any suitable path 232 can be used. In the heat exchanger 230, the cool, liquid-vapor mixture refrigerant absorbs heat from the liquid coolant also passing through the heat exchanger 230. As it absorbs heat, the liquid refrigerant can evaporate into a low-pressure vapor, which can be provided to the compressor 234 to compress into a high-pressure vapor. The refrigerant cycle 252 can be tuned in various fashions, such as by selecting a refrigerant with a sufficiently low boiling point.

In some cases, certain components of the hybrid cooling system 200 can be physically spaced apart from the heat-generating component 202 and/or other components of the computing devices. In some cases, a barrier 256 can be established between the heat-generating component 202 and one or more components of the hybrid cooling system 200. In some cases, the barrier 256 separates the cold plate 204 from the other components of the hybrid cooling system 200. Connectors at the barrier 256 can be used to fluidly couple the cold plate 204 with the pump 208 and heat exchanger 230. In some cases, some of the components depicted as above the barrier 256 in FIG. 2 may be instead positioned on the opposite side of the barrier 256. In some cases, no barrier 256 is used.

While depicted with certain components, in some cases, the hybrid cooling system 200 can use additional components. In some cases, a single hybrid cooling system can provide cooling to a number of heat-generating components 202. For example, pipe 218 can split into multiple branches, providing liquid coolant to multiple cold plates, each of which is coupled to its own respective heat-generating component. In such a case, the multiple branches can rejoin together at pipe 214.

Figure 3:
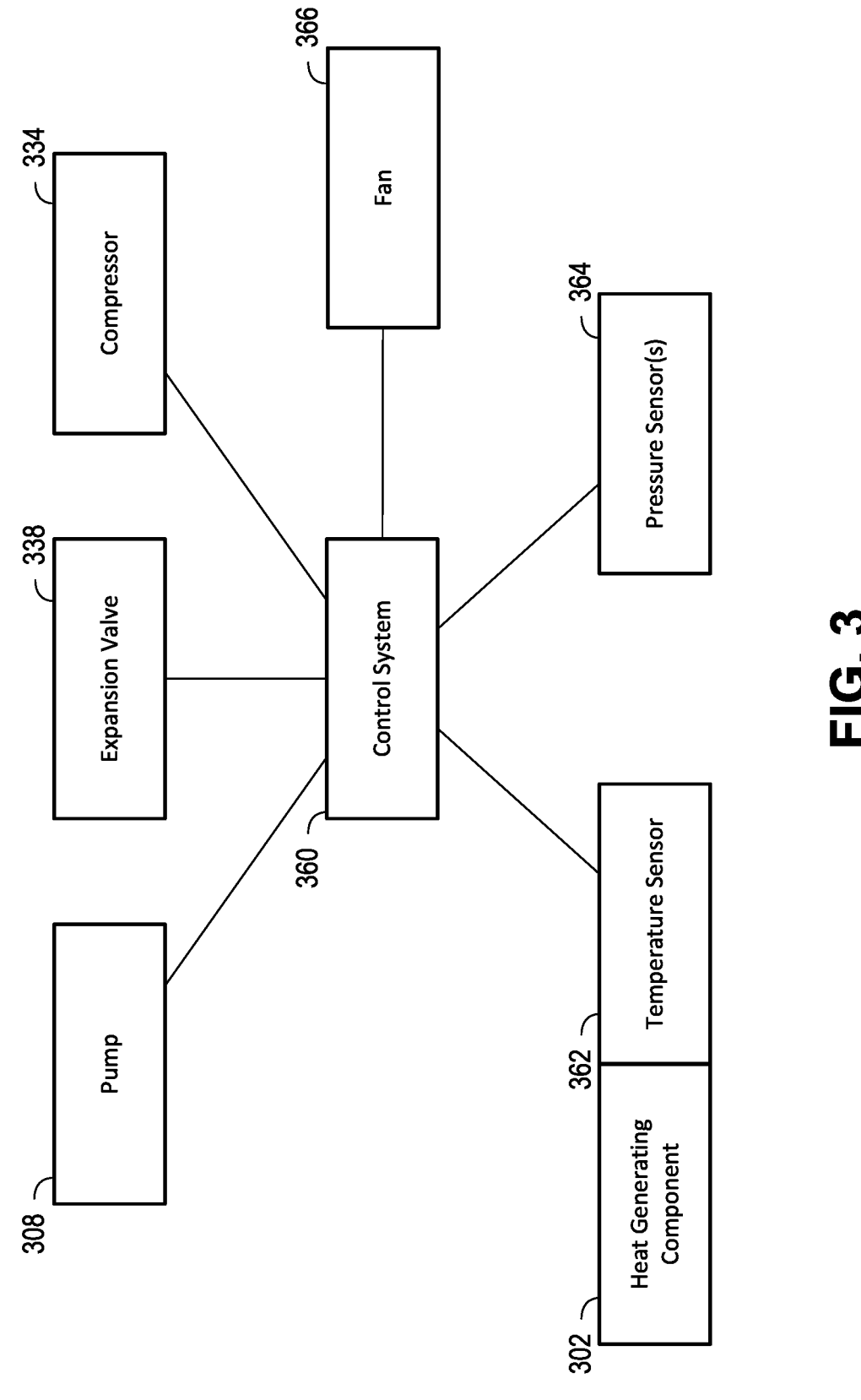
FIG. 3 is a block diagram of a system for controlling a hybrid cooling system, according to certain aspects of the present disclosure.

FIG. 3 is a block diagram of a system 300 for controlling a hybrid cooling system, according to certain aspects of the present disclosure. The system 300 can control any suitable hybrid cooling system, such as hybrid cooling system 200 of FIG. 2.

Control system 360 can include one or more processor and memory suitable for executing the instructions necessary to carry out its functions, as described in further detail herein. For example, the control system 360 can be a baseboard management controller (BMC), can be embodied in the operating system of the computing device in which the heat-generating component is installed, or can be an external system (e.g., a thermal management system managing an entire rack of computing devices or an entire room of computing devices).

In some cases, the control system 360 can be communicatively coupled to a temperature sensor 262 to collect temperature information (e.g., a temperature signal). In some cases, the temperature sensor 362 is adjacent to, coupled to, or embedded within the heat-generating component 302 to measure a temperature associated with the heat-generating component 302. In some cases, however, the temperature sensor 362 can be thermally coupled to another component to measure other temperatures, such as a temperature of a working fluid (e.g., liquid coolant or refrigerant) in the hybrid cooling system. In some cases, multiple temperature sensors 362 are used.

In some cases, the control system 360 can be communicatively coupled to one or more pressure sensors 364 to collect pressure information (e.g., one or more pressure signals). A pressure sensor 364 can be positioned to determine a pressure of the refrigerant at various points along the refrigerant pathway loop, such as between the compressor 334 and the condenser (e.g., a high-pressure vapor reading), between the condenser and the expansion valve 338 (e.g., a high-pressure liquid reading), between the expansion valve 338 and the heat exchanger (e.g., a low-pressure liquid reading), and/or between the heat exchanger and the compressor (e.g., a low-pressure vapor reading).

Based on the temperature signal(s) received from the temperature sensor(s) 362 and/or the pressure signal(s) received from the pressure sensor(s) 364, the control system 360 can control i) the pump 308 to increase or decrease the flow rate of the liquid coolant through the liquid coolant pathway loop; ii) the compressor 334 to increase or decrease the pressure/temperature of the refrigerant entering the condenser; iii) expansion valve 338 (e.g., an electromagnetic expansion valve with an adjustable throttle opening) to increase or decrease the pressure/temperature of the refrigerant entering the heat exchanger; iv) one or more fan 366 forcing air past the condenser; or v) any combination of i-iv.

For example, if the heat-generating component 302 is getting too hot, increased cooling power can be obtained by increasing the liquid coolant flow rate via the pump 308, increasing the amount of heat dissipated at the condenser by increasing the refrigerant pressure via the compressor 334 and/or increasing the airflow via fan 366.

In some cases, a system 300 can include more or fewer components.

Figure 4:
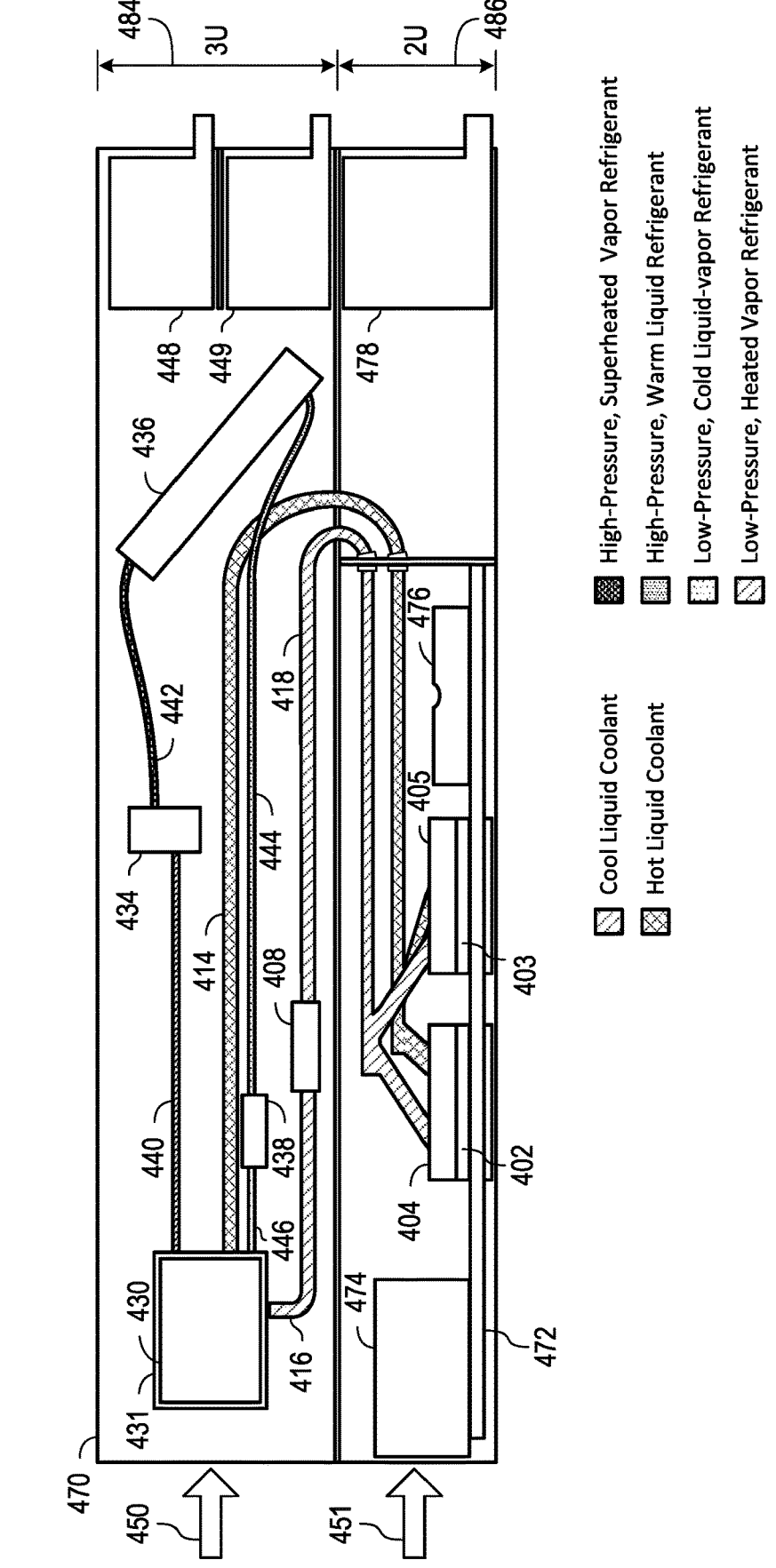
FIG. 4 is a simplified schematic diagram of a side view of a chassis containing a hybrid cooling system, according to certain aspects of the present disclosure.

FIG. 4 is a simplified schematic diagram 400 of a side view of a chassis 470 containing a hybrid cooling system, according to certain aspects of the present disclosure. The hybrid cooling system can be any suitable hybrid cooling system, such as hybrid cooling system 200 of FIG. 2.

As depicted, chassis 470 is a 5 U-high chassis, although any suitable chassis can be used. The chassis 470 supports a motherboard 472 of a computing system. The motherboard 472 can include a number of components, such as a first processor 402 (e.g., a central processing unit), a second processor 403 (e.g., a tensor processing unit), memory 476 (e.g., random access memory), and an expansion card 474 (e.g., a PCIe card). While all of the components on the motherboard 472 may generate some amount of heat during use, first processor 402 and second processor 403 may generate an especially large amount of heat during use, requiring advanced cooling methodology, such as the hybrid cooling system. The other components on the motherboard 472 may be cooled via airflow 451, which can be drawn through the chassis 470 via fan module 478.

A first cold plate 404 is thermally coupled to the first processor 402 and a second cold plate 405 is thermally coupled to the second processor 403. A coolant pathway loop is established between the cold plates 404, 405, which are positioned in parallel in the coolant pathway loop, and the pump 408 and heat exchanger 430, both of which are positioned inline in the coolant pathway loop. Cold liquid coolant is pumped out of the pump 408 and into the cold plates 404, 405 via pipe 418. The liquid coolant absorbs heat from the first processor 402 and second processor 403 via the first cold plate 404 and second cold plate 405, respectively. This heated liquid coolant is carried to the heat exchanger 430 via pipe 414. In the heat exchanger 430, the heated liquid coolant is cooled before exiting via pipe 416 back to the pump 408, thus completing the loop.

Low-pressure, cool liquid-vapor mixture refrigerant from tube 446 enters the heat exchanger 430, where is absorbs heat from the liquid coolant. Due to the refrigerant's relatively low boiling point, the refrigerant boils into a low-pressure, heated vapor as it absorbs the heat from the liquid coolant. This low-pressure, heated vapor refrigerant passes through tube 440 into compressor 434, where it is compressed into a high-pressure, superheated vapor. This high-pressure, superheated vapor refrigerant then passes through tube 442 into condenser 436, where it condenses into a high-pressure, warm liquid as heat is dissipated. This high-pressure, warm liquid refrigerant passes through tube 444 into expansion valve 438, where it rapidly expands into a low-pressure, cold liquid-vapor mixture refrigerant, which is then carried into the heat exchanger 430 via tube 446, thus completing the loop.

The majority of the hybrid cooling system's components are located in the 3 U upper region 484 of the chassis 470, while the computing device, first processor 402, and second processor 403 are located in the 2 U lower region 486. Fan module 478 (e.g., a 2 U fan module) can provide for airflow 451 in the 2 U lower region 486, while fan modules 448, 449 (e.g., 1.5 U fan modules) can cause air to be drawn into the 3 U upper region 484 as airflow 450. This airflow 450 can pass various components of the hybrid cooling system, most importantly the condenser 436. As the airflow 450 passes the condenser 436, it facilitates heat dissipation from the superheated vapor refrigerant into the air of airflow 450. In some cases, the condenser 436 can be placed near an airflow 450 exit of the chassis 470 to prevent the now-heated air from potentially heating other components within the chassis 470. To maximize or otherwise improve efficiency, the condenser 436 can be oriented perpendicular to airflow 450. As depicted in FIG. 4, the condenser 436 may extend into and out of the page by a substantial length. In some cases, that length is longer than the height or depth of the condenser 436. Similarly, other components can be oriented to minimize disruption to airflow 450, permitting airflow 450 to more easily reach the condenser 436. For example, heat exchanger 430 can be oriented parallel with airflow 450. As depicted in FIG. 4, the heat exchanger 430 may extend into and out of the page by a relatively small depth. This depth may be smaller than the length or height of the heat exchanger 430.

In some cases, the heat exchanger 430 can include an insulating shell 431. The insulating shell 431 can be any suitable material, such as fiberglass, plastics, rubbers, and the like. The insulating shell 431 can help minimize or eliminate condensation around the heat exchanger 430. In some cases, some of the various tubes 440, 442, 444, 446 may also be insulated.

While depicted with certain components in certain positioned and orientations, various components of the computing system and hybrid cooling system may be located in different positions and in different orientations within the chassis 470. For example, the computing device may be located in a region that is above the majority of the hybrid cooling system components. Other configurations can be used.

Figure 5:
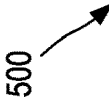
FIG. 5 is a block diagram of an example system architecture for implementing features and processes of the present disclosure.

FIG. 5 is a block diagram of an example system architecture 500 for implementing features and processes of the present disclosure, such as those described with reference to FIGS. 2-4. The system architecture 500 can be used to implement any suitable computing device (e.g., a server, workstation, tablet, or other such device) for practicing the various features and processes of the present disclosure. The system architecture 500 can be implemented on any electronic device that runs software applications derived from compiled instructions, including without limitation personal computers, servers, smart phones, electronic tablets, game consoles, email devices, and the like. In some implementations, the system architecture 500 can include one or more processors 502, one or more input devices 504, one or more display devices 506, one or more network interfaces 508, and one or more computer-readable mediums 510. Each of these components can be coupled by bus 512.

Display device 506 can be any known display technology, including but not limited to display devices using Liquid Crystal Display (LCD) or Light Emitting Diode (LED)

technology. Processor(s) 502 can use any known processor technology, including but not limited to graphics processors and multi-core processors. Input device 504 can be any known input device technology, including but not limited to a keyboard (including a virtual keyboard), mouse, track ball, and touch-sensitive pad or display. Bus 512 can be any known internal or external bus technology, including but not limited to ISA, EISA, PCI, PCI Express, NuBus, USB, Serial ATA or FireWire.

Computer-readable medium 510 can be any medium that participates in providing instructions to processor(s) 502 for execution, including without limitation, non-volatile storage media (e.g., optical disks, magnetic disks, flash drives, etc.) or volatile media (e.g., SDRAM, ROM, etc.). The computer-readable medium (e.g., storage devices, mediums, and memories) can include, for example, a cable or wireless signal containing a bit stream and the like. However, when mentioned, non-transitory computer-readable storage media expressly exclude media such as energy, carrier signals, electromagnetic waves, and signals per se.

Computer-readable medium 510 can include various instructions for implementing operating system 514 and applications 520 such as computer programs. The operating system can be multi-user, multiprocessing, multitasking, multithreading, real-time and the like. The operating system 514 performs basic tasks, including but not limited to: recognizing input from input device 504; sending output to display device 506; keeping track of files and directories on computer-readable medium 510; controlling peripheral devices (e.g., disk drives, printers, etc.) which can be controlled directly or through an I/O controller; and managing traffic on bus 512. Computer-readable medium 510 can include various instructions for implementing firmware processes, such as a BIOS. Computer-readable medium 510 can include various instructions for implementing any of processes described herein, such as those described with reference to FIG. 2-4.

Memory 518 can include high-speed random access memory and/or non-volatile memory, such as one or more magnetic disk storage devices, one or more optical storage devices, and/or flash memory (e.g., NAND, NOR). The memory 518 (e.g., computer-readable storage devices, mediums, and memories) can include a cable or wireless signal containing a bit stream and the like. However, when mentioned, non-transitory computer-readable storage media expressly exclude media such as energy, carrier signals, electromagnetic waves, and signals per se. The memory 518 can store an operating system, such as Darwin, RTXC, LINUX, UNIX, OS X, WINDOWS, or an embedded operating system such as VxWorks.

System controller 522 can be a service processor that operates independently of processor 502. In some implementations, system controller 522 can be a baseboard management controller (BMC). For example, a BMC is a specialized service processor that monitors the physical state of a computer, network server, or other hardware device using sensors and communicating with the system administrator through an independent connection. The BMC is configured on the motherboard or main circuit board of the device to be monitored. The sensors of a BMC can measure internal physical variables such as temperature, humidity, power-supply voltage, fan speeds, communications parameters and operating system (OS) functions.

The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., Objective-C, Java, Python), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The features can be implemented in a computing system that includes a back-end component, such as a data server, or that includes a middleware component, such as an application server or an Internet server, or that includes a front-end component, such as a client computer having a graphical user interface or an Internet browser, or any combination thereof. The components of the system can be connected by any form or medium of digital data communication such as a communication network. Examples of communication networks include, e.g., a LAN, a WAN, and the computers and networks forming the Internet.

The computing system can include clients and servers. A client and server are generally remote from each other and typically interact through a network. The relationship of client and server arises by virtue of computer programs running on the respective computers and having a client-server relationship to each other.

One or more features or steps of the disclosed embodiments can be implemented using an application programming interface (API). An API can define one or more parameters that are passed between a calling application and other software code (e.g., an operating system, library routine, function) that provides a service, that provides data, or that performs an operation or a computation.

The API can be implemented as one or more calls in program code that send or receive one or more parameters through a parameter list or other structure based on a call convention defined in an API specification document. A parameter can be a constant, a key, a data structure, an object, an object class, a variable, a data type, a pointer, an array, a list, or another call. API calls and parameters can be implemented in any programming language. The programming language can define the vocabulary and calling convention that a programmer will employ to access functions supporting the API.

In some implementations, an API call can report to an application the capabilities of a device running the application, such as input capability, output capability, processing capability, power capability, communications capability, and the like.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art. Numerous changes to the disclosed embodiments can be made in accordance with the disclosure herein, without departing from the spirit or scope of the disclosure. Thus, the breadth and scope of the present disclosure should not be limited by any of the above described embodiments.

Although certain aspects and features of the present disclosure have been illustrated and described with respect to one or more implementations, equivalent alterations and modifications will occur or be known to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

The terminology used herein is for the purpose of describing particular embodiments only, and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

One or more elements or aspects or steps, or any portion(s) thereof, from one or more of any of claims 1 to 16 below can be combined with one or more elements or aspects or steps, or any portion(s) thereof, from one or more of any of the other claims 1 to 16 or combinations thereof, to form one or more additional implementations and/or claims of the present disclosure.

What is claimed is:

1. A system, comprising:
a computing device having a heat-generating component;
a cold plate thermally coupled to the heat-generating component;
a coolant pathway loop coupling an exit of the cold plate with an entrance of the cold plate, wherein the coolant pathway loop contains a coolant fluid that enters the cold plate at a lower temperature than when exiting the cold plate;

a refrigerant cycle, the refrigerant cycle including a refrigerant pathway loop coupling a compressor, a condenser, and an expansion valve, wherein the refrigerant pathway loop contains a refrigerant;

a heat exchanger coupled to the coolant pathway loop and the refrigerant pathway loop such that heat in the coolant fluid is transferred to the refrigerant at a location after the expansion valve and before the compressor;

a chassis, wherein the computing device, the coolant pathway loop, and the refrigerant cycle are enclosed within the chassis, the chassis being a multiple U-high chassis that includes at least a 2U lower region and a 3U upper region, the 2U lower region including within the cold plate and the heat-generating component, the 3U upper region including within the heat exchanger and the condenser, the 2U lower region and the 3U upper region separating the cold plate and the heat-generating component from the heat-exchanger and the condenser; and a set of fan modules for drawing air through the chassis and including:

a first fan module located in the 2U lower region to draw air past the cold plate via a first airflow path, the first airflow path starting at a first entry point in the 2U lower region in which the air flowing in the first airflow path enters the chassis, the first airflow path continuing past the cold plate in the 2U lower region to a first exit point in which the air flowing in the first airflow path exits the chassis, the first airflow path avoiding contact with heat exchanger and the condenser in the 3U upper region, and a second fan module located in the 3U upper region to draw air past the heat exchanger via a second airflow path, the second airflow path being separate from and generally parallel to the first airflow path, the second airflow path starting at a second entry point in the 3U upper region in which the air flowing in the second airflow path enters the chassis, the second airflow path continuing past the heat exchanger in the 3U upper region such to a second exit point which the air flowing in the second airflow path exits the chassis, the second airflow path avoiding contact with the cold plate and the heat-generating component in the 2U lower region.

2. The system of claim 1, wherein the coolant pathway loop further includes a pump to facilitate moving the coolant through the coolant pathway loop.

3. The system of claim 2, further comprising:

a temperature sensor associated with the heat-generating component; and a control system, wherein the control system is coupled to the pump to control the pump based at least in part on a temperature signal from the temperature sensor.

4. The system of claim 3, further comprising a pressure sensor coupled to the refrigerant pathway loop, wherein the control system is further coupled to at least one of the compressor and the expansion valve to control the at least one of the compressor and the expansion valve based at least in part on a pressure signal from the pressure sensor.

5. The system of claim 4, wherein the temperature sensor or the pressure sensor is accessible by a baseboard management controller of the computing device.

6. The system of claim 1, wherein the condenser is positioned perpendicular to a direction of airflow through the chassis and the heat exchanger is positioned parallel to the direction of airflow through the chassis.

7. The system of claim 1, wherein the heat exchanger is thermally insulated from a surrounding environment.

8. The system of claim 1, wherein the heat-generating component includes a processor.

9. A method, comprising:

providing a multiple U-high chassis enclosing a computing device, a coolant pathway loop, and a refrigerant cycle, the multiple U-high chassis including at least a 2U lower region and a 3U upper region, the 2U lower region including within a cold plate and a heat-generating component, the 3U upper region including within a heat exchanger and a condenser, the 2U lower region and the 3U upper region separating the cold plate and the heat-generating component from the heat-exchanger and the condenser;

operating the computing device such that heat is generated at the heat-generating component;

pumping coolant through the coolant pathway loop, the coolant being pumped through the cold plate and the heat exchanger, the cold plate being thermally coupled to the heat-generating component;

compressing a refrigerant within a refrigerant pathway loop, the compressing causing compressed refrigerant to pass through the condenser and an expansion valve before reaching the heat exchanger, the refrigerant passing through the heat exchanger extracting heat from the coolant passing through the heat exchanger; and drawing air (i) past the cold plate via a first fan module located in the 2U lower region, the air past the cold plate being drawn via a first airflow path, the first airflow path starting at a first entry point in the 2U lower region in which the air flowing in the first airflow path enters the chassis, the first airflow path continuing past the cold plate in the 2U lower region to a first exit point in which the air flowing in the first airflow path exits the chassis, the first airflow path avoiding contact with heat exchanger and the condenser in the 3U upper region, and (ii) past the heat exchanger via a second fan module located in the 3U upper region, the air drawn past the heat exchanger being drawn via a second airflow path, the second airflow path being separate from and generally parallel to the first airflow path, the second airflow path starting at a second entry point in the 3U upper region in which the air flowing in the second airflow path enters the chassis, the second airflow path continuing past the heat exchanger in the 3U upper region such to a second exit point which the air flowing in the second airflow path exits the chassis, the second airflow path avoiding contact with the cold plate and the heat-generating component in the 2U lower region.

10. The method of claim 9, further comprising facilitating pumping, via a pump, the coolant through the coolant pathway loop.

11. The method of claim 10, further comprising:

collecting temperature data at a temperature sensor associated with the heat-generating component; and controlling the pump, by a control system, based at least in part on the temperature data from the temperature sensor.

12. The method of claim 11, further comprising:

collecting pressure data at a pressure sensor associated with the refrigerant pathway loop; and controlling at least one of the compressor and the expansion valve, by the control system, based at least in part on the pressure data from the pressure sensor.

13. The method of claim 11, wherein the temperature sensor is accessible by a baseboard management controller of the computing device.

14. The method of claim 9, wherein the condenser is positioned perpendicular to a direction of airflow through the chassis and the heat exchanger is positioned parallel to the direction of airflow through the chassis.

15. The method of claim 9, wherein the heat exchanger is thermally insulated from a surrounding environment.

16. The method of claim 9, wherein the heat-generating component includes a processor.

* * * * *